United States Patent
Sritulanont et al.

(10) Patent No.: US 6,382,395 B1
(45) Date of Patent: May 7, 2002

(54) METHOD AND SYSTEM FOR PACKAGE ORIENTATION CHECKING FOR LASER MARK OPERATIONS

(75) Inventors: Somboon Sritulanont, Nonthaburi; Naramitr Jitramas, Bangkok; Amorn Hongmala, Phattalung, all of (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/632,499

(22) Filed: Aug. 3, 2000

(51) Int. Cl.[7] ............................................. B65G 47/24
(52) U.S. Cl. ........................................ 198/398; 193/44
(58) Field of Search ........................... 198/398, 345.1; 193/44

(56) References Cited

U.S. PATENT DOCUMENTS

| | | | | |
|---|---|---|---|---|
| 3,260,363 A | * | 7/1966 | Vukosic ................ | 198/398 X |
| 3,815,731 A | * | 6/1974 | Lupo et al. ............ | 198/398 |
| 3,990,571 A | * | 11/1976 | Kitterman et al. ...... | 198/398 X |
| 4,170,021 A | * | 10/1979 | Du Bois et al. ........ | 198/398 X |
| 4,509,646 A | * | 4/1985 | Eitzinger ............... | 198/398 X |
| 4,800,999 A | * | 1/1989 | Matsuo .................. | 198/370 X |
| 6,051,845 A | * | 4/2000 | Uritsky ................. | 250/559.3 X |

* cited by examiner

Primary Examiner—Joseph E. Valenza
Assistant Examiner—Gene O. Crawford
(74) Attorney, Agent, or Firm—Sawyer Law Group LLP

(57) ABSTRACT

Aspects for package orientation checking in a laser marking machine are provided. In a system aspect, the system includes a handler, the handler including a unit loader. A laser mark chamber receives units from the handler for laser marking. A package orientation checking mechanism is positioned between the unit loader and the laser mark chamber for detecting an orientation of each unit passing to the laser mark chamber based on a chamfer side of each unit.

19 Claims, 2 Drawing Sheets

METHOD AND SYSTEM FOR PACKAGE ORIENTATION CHECKING FOR LASER MARK OPERATIONS

FIELD OF THE INVENTION

The present invention relates to laser mark operations, and more particularly to ensuring proper orientation of packages for laser mark operations.

BACKGROUND OF THE INVENTION

It has become increasingly popular to use a laser beam to mark the surface of a chip package. Laser marking is fast, requires no curing time, and produces a consistently high-quality mark with minimal set-up time. In laser marking machines, the laser beam basically burns a mark into the surface of the article of manufacture to produce a permanent mark. In the case of a packaged chip, the laser marking creates a different reflectivity from the rest of the package surface. Thus, by holding the chip at an angle to a light source, the information inscribed on the chip by the laser can easily be read.

FIG. 1 illustrates a diagram of a tube-to-tube handler 10 and laser mark chamber 12 of a laser marking machine for marking packages of integrated circuits with logos, date, part number, and other package identifiers. To ensure correct marking, it is essential that units 14 enter the laser mark chamber 12 on the conveyor or rail 16 of the handler 12 in the proper orientation. Normally, the handler 10 of laser mark modules is either not equipped at all with a feature to detect the orientation of the packages, or it comes with a feature that uses pins to detect pin 1 on a chamfer side of the package. The feature to detect pin 1 is not very effective, however, since it needs to be set up very precisely, and needs constant readjustment.

Accordingly, a need exists for effective and efficient orientation checking of packages in a laser mark machine.

SUMMARY OF THE INVENTION

Aspects for package orientation checking in a laser marking machine are provided. In a system aspect, the system includes a handler, the handler including a unit loader. A laser mark chamber receives units from the handler for laser marking. A package orientation checking mechanism is positioned between the unit loader and the laser mark chamber for detecting an orientation of each unit passing to the laser mark chamber based on a chamfer side of each unit.

Through the present invention, accurate and reliable detection of wrongly oriented packages in a laser mark machine is achieved. Further, the use of the tunnel provides flexibility for package orientation detection of a variety of packages, since tunnels can be easily changed to accommodate different package sizes. These and other advantages of the present invention will be more fully understood in conjunction with the following detailed description and accompanying drawings.

DETAILED DESCRIPTION

The present invention relates to a orientation checking system for laser marking operations. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
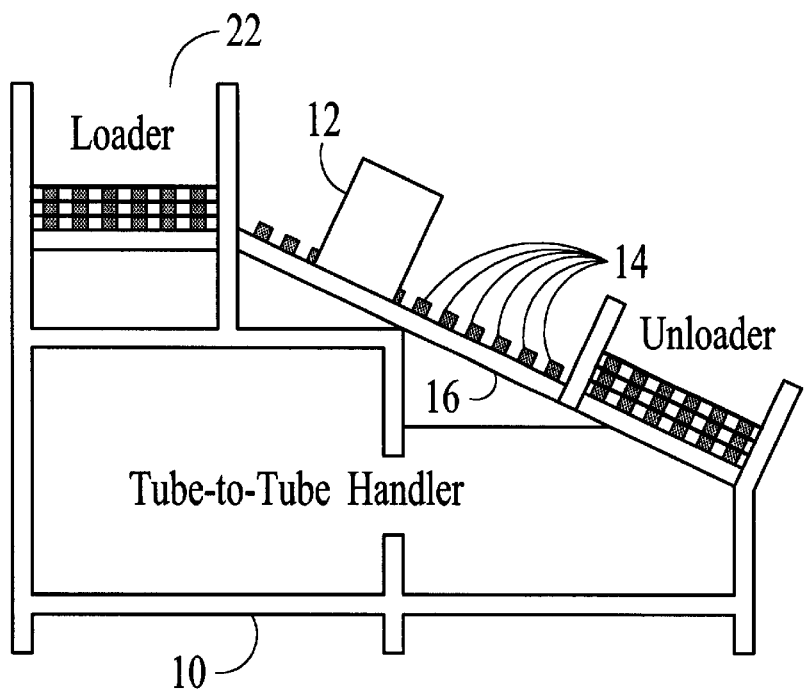
FIG. 1 illustrates a diagram of a prior art tube-to-tube handler and laser marker.
Figure 2:
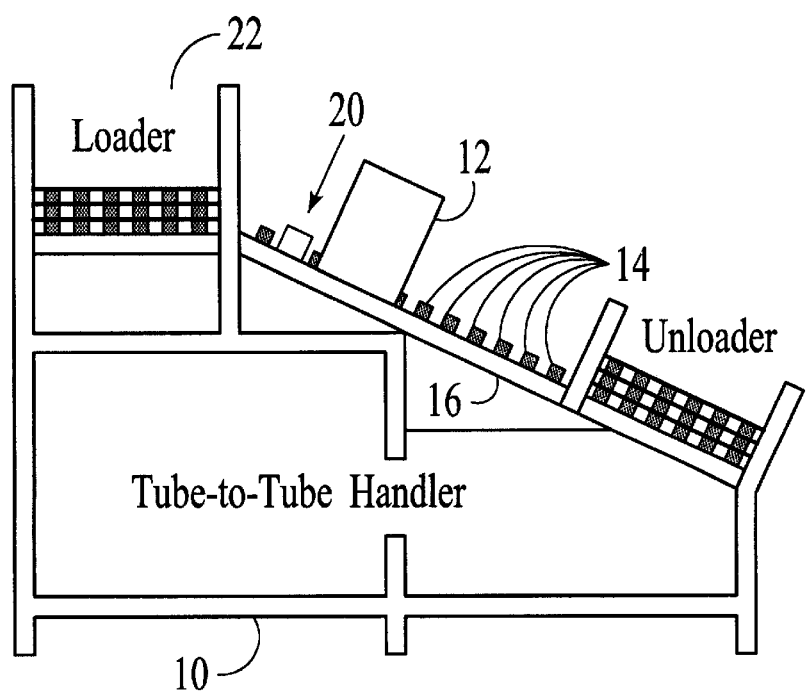
FIG. 2 illustrates a diagram of a tube-to-tube handler and laser marker with an orientation checker in accordance with the present invention.

In accordance with the present invention, a tunnel installed over the conveyor or rail of a handler of a laser marking machine before the laser mark chamber exploits the chamfer side of the packages, so that wrongly oriented packages are not able to pass through the tunnel to the laser mark chamber. As shown by FIG. 2, in which like components are labeled similarly to FIG. 1, the tunnel 20 is installed between a loader 22 of the handler 10 and the laser mark chamber 12.

Figure 3:
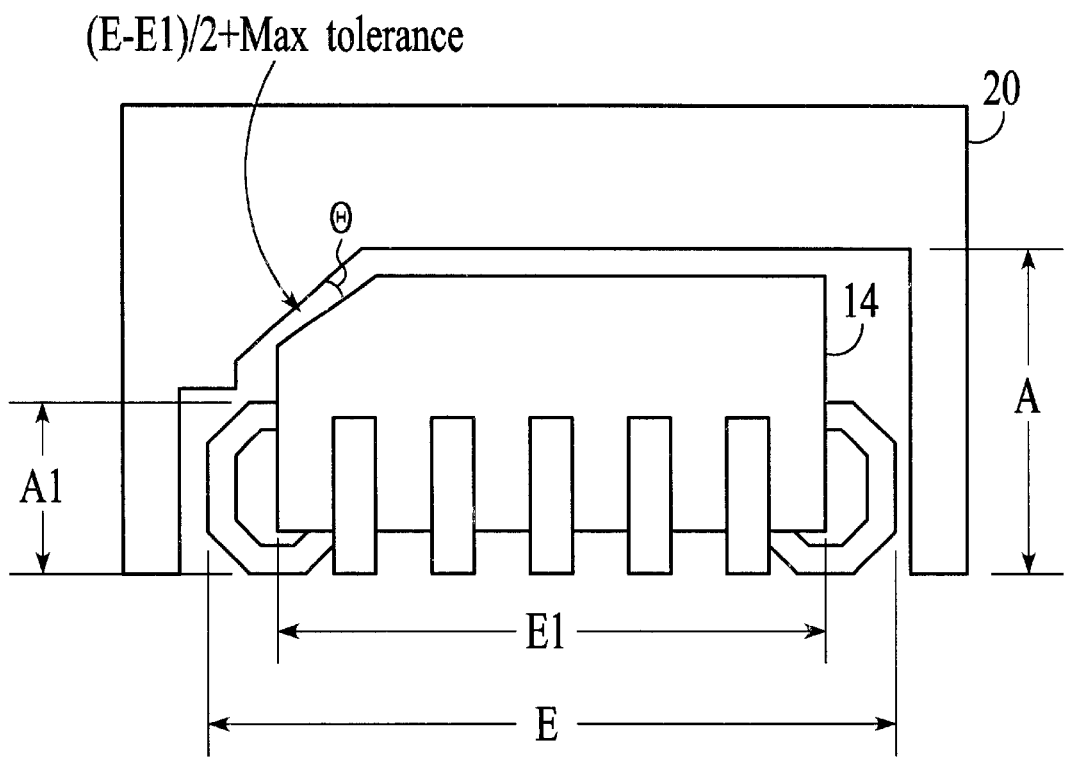
FIG. 3 illustrates a diagram of a tunnel and passageway for the orientation checker in accordance with the present invention.

The tunnel 20 preferably comprises a stainless steel tunnel with a passageway formed there through in accordance with the dimensions of the package units being marked, as described with reference to FIG. 3. As shown in FIG. 3, the design of the orientation checking tunnel 20 is based on the following package 14 dimensions (parameters):

package height (maximum A dimension parameter);
lead height (maximum A1 dimension parameter);
package width (maximum E dimension parameter);
package to lead space (maximum E−minimum E1 dimension parameter divided by 2); and
chamfer detection angle θ (e.g., about 45 degrees for PLCC (plastic leaded chip carrier) packages)

Tolerance between the package 14 and the inner walls of the tunnel 20 for all dimensions is suitably a minimum 0.0 and maximum of (maximum dimension parameter−minimum dimension parameter).

As the units 14 are moved on the conveyor 16 through the tunnel 20, the flow of the units 14 is stopped on the conveyor 16 when a wrongly oriented unit is at the tunnel 20. The stoppage causes jam sensors of a control mechanism (not shown) of the handler 10 to stop the equipment until the cause of the jam is removed. Thus, there is substantially no opportunity for a wrongly oriented package to escape detection and enter the laser mark chamber. The use of the tunnel in accordance with the present invention therefore achieves more accuracy and reliability in comparison to standard features that attempt to detect pin 1 of packages to detect orientation. Further, the use of the tunnel has no need for readjustment, since tunnels can be easily changed to accommodate different package sizes.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for package orientation checking in a laser marking machine, the system comprising:
    a handler, the handler including a unit loader;
    a laser mark chamber for receiving units from the handler for laser marking; and package orientation checking means positioned between the unit loader and the laser mark chamber for detecting an orientation of each unit passing to the laser mark chamber based on a chamfer side of each unit.

2. The system of claim 1 wherein the handler further comprises a conveyor means for moving the units to the laser mark chamber from the unit loader.

3. The system of claim 2 wherein the package orientation means further comprises a tunnel means positioned over the conveyor means and having a passageway through which the units on the conveyor attempt to move.

4. The system of claim 3 wherein the tunnel means further comprises a stainless steel tunnel.

5. The system of claim 3 wherein the passageway further comprises an opening in the tunnel means having dimensions determined by package dimensions of the units.

6. The system of claim 5 wherein the package dimensions further comprise package height, lead height, package width, package to lead space, and a chamfer detection angle.

7. The system of claim 6 wherein the units further comprise plastic leaded chip carrier (PLCC) package units.

8. The system of claim 7 wherein the chamfer detection angle further comprises an angle of about 45 degrees.

9. A method for ensuring proper package orientation during laser marking operations, the method comprising:

moving units from a loader of a handler to a laser mark chamber of a laser mark machine; and checking a package orientation based on a chamfer side of each unit as the units move from the loader to the laser mark chamber.

10. The method of claim 9 wherein moving units further comprises moving units on a conveyor through a tunnel, the tunnel having an opening that limits passage of the units based on the chamfer side of each unit.

11. The method of claim 10 wherein checking a package orientation further comprises detecting a jam in the moving at the tunnel when a wrongly oriented unit does not pass through the opening.

12. The method of claim 11 wherein detecting a jam further comprises detecting that the chamfer side of a unit is not aligned with an angled portion of the opening.

13. The method of claim 12 further comprising providing the angled portion with a angle slope corresponding to a angle slope of the chamfer side of the units.

14. A package orientation checker system for a laser mark machine comprising:

a conveyor for moving units from a handler to a laser mark chamber of the laser mark machine; and a tunnel means positioned over the conveyor and having a passageway with dimensions corresponding to package dimensions of the moving units.

15. The system of claim 14 wherein the tunnel means further comprises a stainless steel tunnel.

16. The system of claim 15 wherein the passageway further comprises an opening in the tunnel means having a chamfer detection angle for limiting passage of units based on a chamfer side of each unit.

17. The system of claim 16 wherein the opening further corresponds with dimensions for package height, package width, lead height, and package to lead space dimensions of the units.

18. The system of claim 16 wherein the chamfer detection angle corresponds with a chamfer dimension of plastic leaded chip carrier (PLCC) packages.

19. The system of claim 18 wherein the chamfer detection angle further comprises an angle of about 45 degrees.

* * * * *